United States Patent [19]

Salmon

[11] Patent Number: 5,379,249

[45] Date of Patent: Jan. 3, 1995

[54] UPROM PROGRAMMING PROTECT CIRCUIT

[75] Inventor: Joseph H. Salmon, Placerville, Calif.

[73] Assignee: Intel Corporation, Santa Clara, Calif.

[21] Appl. No.: 249,055

[22] Filed: May 25, 1994

Related U.S. Application Data

[63] Continuation of Ser. No. 940,545, Sep. 4, 1992, abandoned.

[51] Int. Cl.⁶ ............................................. G11C 17/00
[52] U.S. Cl. ..................................... 365/104; 365/201
[58] Field of Search ................. 365/200, 201, 49, 185, 365/154, 53, 104

[56] References Cited

U.S. PATENT DOCUMENTS

| | | | |
|---|---|---|---|
| 4,530,074 | 7/1985 | Folsmbee | 365/53 |
| 5,046,046 | 9/1991 | Sweha | 365/200 |
| 5,088,066 | 2/1992 | Castro | 365/200 |
| 5,136,544 | 8/1992 | Rozman | 365/154 |

Primary Examiner—Eugene R. LaRoche
Assistant Examiner—A. Zarabian
Attorney, Agent, or Firm—Blakely, Sokoloff, Taylor & Zafman

[57] ABSTRACT

A UPROM circuit including a pair of UPROM devices arranged to provide a first output level when one of the pair of UPROM devices is programmed and a second output level when the other of the UPROM devices is programmed. The UPROM circuit is programmed by circuitry which selectively provides programming voltages to each of the UPROM devices. Apparatus is provided for sensing the condition of the UPROM devices and feeding back signals for disabling the circuitry providing programming voltages whenever one of the UPROM devices is already programmed.

3 Claims, 1 Drawing Sheet

UPROM PROGRAMMING PROTECT CIRCUIT

This is a continuation of application Ser. No. 07/940,545, filed Sep. 4, 1992, now abandoned.

BACKGROUND OF THE INVENTION

1. Field Of The Invention

This invention relates to circuits for controlling programmable configuration circuitry and, more particularly, to circuitry for protecting a pair of UPROM memory cells against reprogramming once one of the cells has been programmed.

2. History Of The Prior Art

A UPROM based configuration circuit which utilizes a pair of UPROM devices is used in many digital circuits to provide a voltage of a predetermined value which may be used in an associated circuit as a logical one or a zero value. A UPROM device is essentially an electrically programmable read only memory device (EPROM device) with some means of protecting against its condition being changed once it has been placed in a particular condition. Typically the memory device is a floating gate field effect transistor capable of assuming a programmed condition or an erased condition. In the programmed condition, no current flows between the source and drain terminals of the transistor; while in the erased condition, the transistor conducts between these terminals. This type of UPROM circuit is utilized because it allows a programmable voltage value to be provided continuously at its output without drawing a significant amount of current. Consequently, the arrangement allows a given voltage to be maintained without a great deal of power consumption.

Such a circuit includes a pair of UPROM transistors with cross-coupled biasing means and circuitry for placing one or the other of the two UPROM transistors in the programmed state. If a first one of the UPROM transistors is programmed, then one voltage is provided constantly at the output. If the other one of the UPROM transistors is programmed, then another voltage is provided constantly at the output. These voltage values are, as pointed out above, used as logical one and zero values. Typically, such a circuit is programmed to a first output value at the factory and sold to be used for one purpose, or programmed to a second output value and sold to be used for another purpose.

It is possible that both such transistors of the UPROM circuit may be programmed (and consequently non-conducting) rather than just one transistor. For example, a test program may cause advertent programming of the UPROM transistors if the program is written incorrectly. In such a case, the output voltage provided by the UPROM circuit is indeterminate and depends to a great extent upon the characteristics of the individual biasing devices used in the circuit. Since in the present arrangement the voltage value established is the value which is used to configure the UPROM circuit to produce one of two output values which is to be used to establish a level for a logic value used in a digital circuit, a circuit which provides an indeterminate value can cause significant difficulties.

In prior art arrangements utilizing such UPROM devices to provide a selectable output voltage, it has been typical to provide an independent circuit which protects against the unprogrammed one of the two UPROM devices being programmed once the other UPROM device has been placed in the programmed condition. Typically, this independent circuit is a circuit similar to the circuitry which is itself programmed to produce the desired output. Such a circuit uses a number of components and, therefore, adds some substantial expense to the overall circuit. In prior art arrangements, however, the protection circuitry has typically been used to guard against the programming of a number of such UPROM cells; and, consequently, its expense has been relatively small when distributed over the cost of all of the circuits. In the desired use, however, only a single UPROM circuit is to be protected so the relative expense is much greater. Consequently, the use of the prior art protection circuit is less desirable.

Moreover, the prior art protection circuit only comes into operation once the UPROM circuit has been programmed. A time period exists after programming the first UPROM during which no protection exists, and it is possible to program the other UPROM during that period. Such programming would leave the UPROM circuit in the undesirable condition in which an indeterminate output voltage is produced.

For these reasons, it is desirable to provide improved protection against programming of the UPROM memory transistors once the appropriate programmed state for the UPROM circuit has been selected.

SUMMARY OF THE INVENTION

It is, therefore, an object of the present invention to provide a unique circuit for protecting against the programming of a UPROM voltage control circuit once either of the UPROM devices has been programmed.

These and other objects of the present invention are realized in a UPROM circuit comprising a pair of UPROM devices arranged to provide a first output level when one of the pair of UPROM devices is programmed and a second output level when the other of the UPROM devices is programmed, means for selectively providing programming voltages to each of the UPROM devices, and means for sensing the condition of the UPROM devices to disable the means for selectively providing programming voltages to each of the UPROM devices whenever one of the UPROM devices is programmed.

These and other objects and features of the invention will be better understood by reference to the detailed description which follows taken together with the drawings in which like elements are referred to by like designations throughout the several views.

DETAILED DESCRIPTION OF THE INVENTION

Figure 1:
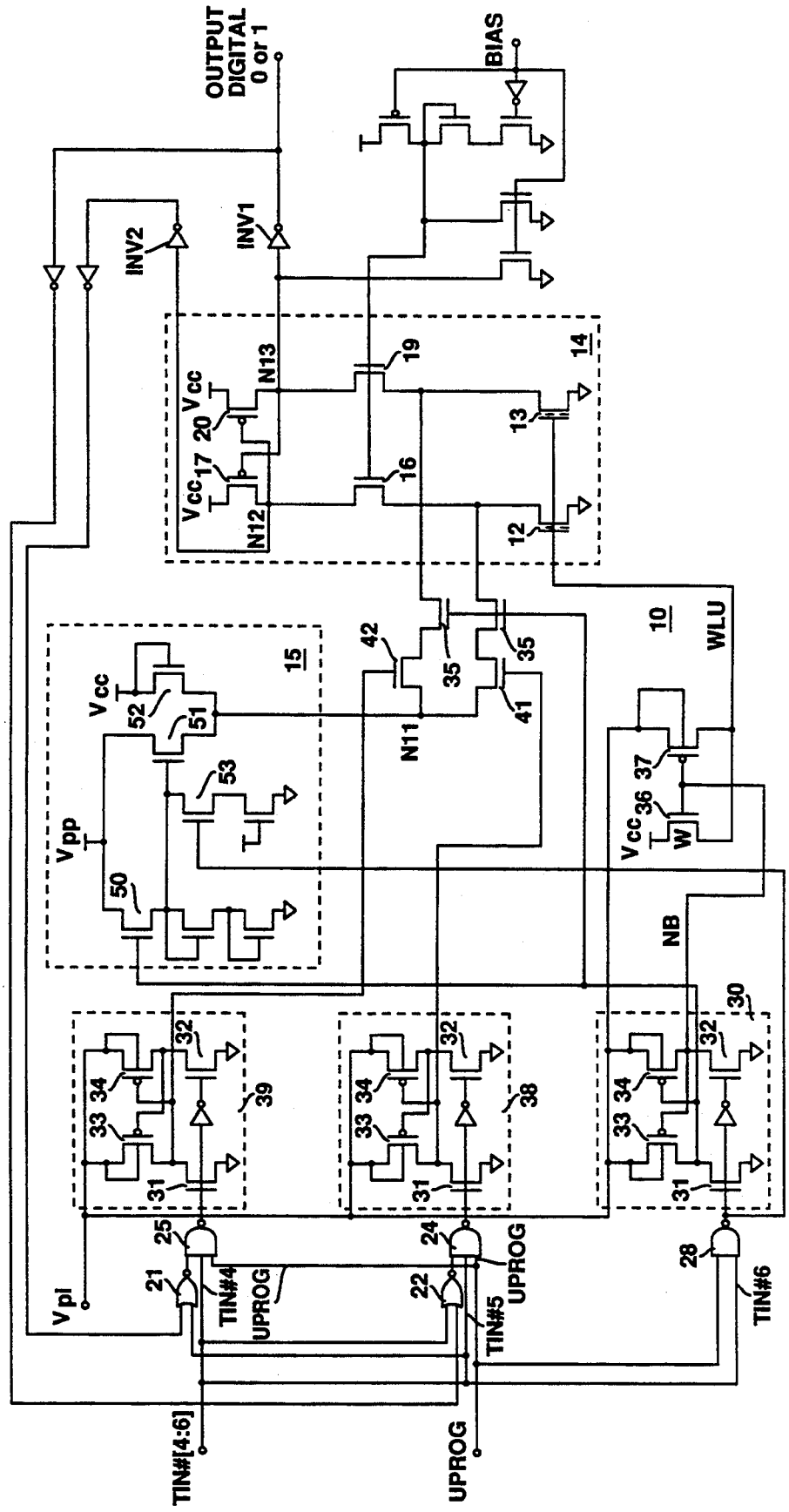
FIG. 1 is a circuit diagram illustrating an arrangement in accordance with the present invention for generating a constant programmable output voltage value.

Referring now to FIG. 1, there is illustrated a circuit 10 for providing one or the other of two output voltages. The circuit 10 includes a UPROM circuit 14 which contains a first UPROM transistor device 12 and a second UPROM transistor device 13. Each of these devices is basically a floating gate metal-oxide silicon field effect transistor similar to an EPROM but covered by a layer of metal and other layers arranged to keep the transistor from being affected by ultra violet rays and, consequently, not erasable by ultraviolet light in the manner of a standard EPROM cell. Such a device is disclosed in U.S. Pat. No. 4,530,074, entitled *Radiation*

*Shield for a Portion of a Radiation Sensitive Integrated Circuit*, A. Folmsbee, issued Jul. 16, 1985, and assigned to the assignee of the present invention. Devices 12 and 13 are each UPROM devices of this type. The device 12 is connected to ground and by an N channel device 16 and a P channel device 17 to a positive source of voltage Vcc. The device 13 is similarly connected to ground and by an N channel device 19 and a P channel device 20 to the positive source of voltage Vcc.

When power is applied to the circuit 10, approximately five volts is applied at the gate terminals of each of the devices 12 and 13. A zero value applied at a "Bias" terminal causes approximately 2.5 volts to be applied at the gates of the devices 16 and 19. If the one of the two devices 12 and 13 is erased while the other is programmed, the erased device conducts. Presuming the erased device is device 13, the device 19 also conducts; and the value at a node N13 is brought near ground to furnish an output value equivalent to a binary zero. The value at the node N13 enables the transistor 17 so that a value of Vcc or approximately five volts is applied at a node N12 (between the devices 16 and 17) and at the gate of the transistor 20. This disables the transistor 20. Consequently, since the device 13 is on, the node N13 remains at the zero voltage value. However, the node N12 is at five volts disabling the transistor 20 so that current through the device 13 is essentially cut off. Because of this, the circuit 14 including the devices 12 and 13 may be used to furnish an output voltage level of approximately ground without dissipating any significant amount of power when the transistor 12 is programmed and the device 13 is erased. This output voltage may be used to establish a level for a digital value to be used by circuitry connected to the node N13 (not shown in the FIGURE).

If, on the other hand, the device 13 is programmed (and non-conducting) and the device 12 is erased (and conducting), then when power is applied to the circuit 10, the device 12 conducts as does the N channel device 16. This applies ground at the gate of the transistor 20. The transistor 20 conducts, and a voltage of Vcc is applied at the gate of the device 17 to turn that device off. With the device 13 off and the device 20 conducting, a high value is furnished at the node N13 and a low value is furnished at the node N12. With the device 17 off, current through the device 12 is essentially zero. Thus, the programming of the device 13 provides a second output level at the node N13 which may be used as a logical value in as associated circuit connected to that node.

Each of the P channel devices 17 and 20 is sized to be a weak device (one capable of transferring relatively little current) so that full logic levels are output by inverters INV1 and INV2 and so that power dissipation by the circuit is minimal even though both of the devices 12 and 13 are erased. This is the initial condition of the circuit 14 before programming takes place and assures that accurate programming may be accomplished.

On the other hand, the normal condition of the circuit 14 when it is used is that one or the other of the devices 12 or 13 is programmed. If for some reason, both of the devices 12 and 13 are inadvertently programmed such as by an incorrect test program, when power is applied to the circuit 10, neither of the devices 12 or 13 will conduct. The value of the output voltage at the nodes N12 and N13 will then depend on which of the transistors 17 or 20 switches on first. The individual characteristics of the devices 16, 17, 19, and 20 will influence this result; and it may vary from operation to operation. Since such incorrect programming may occur during testing prior to release of the circuit for sale, it is possible for a part to be released which will operate to provide an incorrect output value.

Heretofore, whenever a circuit such as the circuit 14 of FIG. 1 has been utilized to provide a programmed output voltage and it is desired to protect against the variation of that value through an inadvertency such as incorrect programming, another circuit almost identical to the entire circuit 10 has been provided to control the values provided to program the devices 12 and 13 so that once one UPROM device has been programmed, the other UPROM device cannot be programmed. When the output voltage provided by the control circuit is used as a control voltage for a number of circuits such as the circuit 14, the cost of this extra protection circuitry is relatively insignificant. In the present case, however, only a single circuit 14 utilizes the control voltage so the cost of the prior art protection circuit is excessive. Moreover, the protection circuits provided by the prior art do not operate until the programming of one of the UPROM devices has been completed and the voltage values are available to be sensed. Consequently, there exists a period during which it is still possible to program a second UPROM device even though a first one of the devices has already been programmed. The circuit of the present invention precludes this result and is very inexpensive compared to prior art arrangements.

In order to understand the invention, the manner in which the circuit 14 is programmed needs to be understood. Initially, both devices 12 and 13 are erased. At the application of power to the circuit 10, a voltage equal to Vcc (approximately 5 volts) is applied to the gates of each of the transistors 12 and 13. This causes the devices 12 and 13 to turn on placing nodes N12 and N13 each approximately at ground (zero value). The zero value at node N12 is inverted twice and applied at the input of a NOR gate 21. The zero value at node N13 is inverted twice and applied at the input of a NOR gate 22. These zero values may be inverted by the NOR gates 21 and 22 and applied as one valued inputs at a pair of NAND gates 24 and 25, respectively. These values are such that either one of the two devices 12 or 13 may be programmed.

Signal values are applied at the input of the circuit 10 to indicate the one of the UPROM devices which is to be programmed. Initially, a one value programming signal UPROG is applied at the NAND gate 24, the NAND gate 25, and a NOR gate 26. Also applied is a one value signal TIN#4 or TIN#5 to select the one of the two UPROM devices 12 or 13 to program. The signal TIN#4 selects the UPROM device 13 while the signal TIN#5 selects the UPROM device 12. The UPROG signal is applied as a one value to the input of a NAND gate 28. An input signal TIN#6 is applied and provides a one value at the remaining terminal of the NAND gate 28 to signify that programming is taking place. These two one values cause the NAND gate 28 to generate a zero at its output which is transferred to the input to a high voltage switch 30. The high voltage switch 30 provides signals which enable circuitry which provides programming voltages to the UPROM circuitry 14.

Within the circuitry of the switch 30, the zero value signal holds an N channel device 31 in the off condition and is inverted and turns on an N channel device 32. This causes a node N8 to be brought close to ground (a zero value). The zero value turns on a P channel device 33 which applies a voltage Vpi at the gate of a cross-coupled P channel device 34 to hold that transistor off.

The value of Vpi during programming is the programming voltage Vpp which is approximately 12.5 volts in the preferred embodiment. This value is furnished to enable a pair of N channel devices 35 each of which lies in one of two paths from a source of the programming voltage Vpp to the drain terminals of each of the UPROM devices 12 and 13. Thus, each of the two paths to the drain terminals of those devices is ready to be activated if that particular path is selected.

The zero value voltage at node N8 is furnished to the gates of a W channel device 36 and a P channel device 37. A W channel device is structured as a no-implant device so that the normal switching voltage Vt which may be expected is zero. The W channel device 36 is disabled removing the voltage Vcc-Vtw on the wordline WLU from the gates of the UPROM devices 12 and 13. Simultaneously, the P channel device 37 turns on and furnishes the voltage Vpi to the gates of the devices 12 and 13.

If the input signal for selecting the UPROM device to be programmed is TIN#5, this value is applied with the other one values to the input of the NAND gate 24 to produce a zero valued output signal. The one value on the input TIN#5 is also transferred to the input of the NOR gate 21. This causes the NOR gate 21 to provide a zero value output which generates a one value at the output of the NAND gate 25. The zero value at the output of the NAND gate 24 is furnished at the input to a second high voltage switch 38 while the one value from the NAND gate 25 in furnished to a third high voltage switch 39. The two switches 38 and 39 are identical to the switch 30; and the devices therein are identified using the same numbers. The switch 38 produces an output voltage of Vpi between the devices 31 and 33. This value is used to enable an N channel device 41. At the same time, the switch 39 produces an output voltage near ground between the devices 31 and 33. This value is used to disable an N channel device 42.

If the input signal for selecting the UPROM device to be programmed is TIN#4, then the circuits 38 and 39 operate as explained above except that the result is that the N channel device 42 is enabled and the N channel device 41 is disabled.

The devices 41 and 42 are connected in the separate paths from the circuit which furnishes a programming voltage to the drain terminals of the two devices 12 and 13. When the device 41 is conducting, the UPROM device 12 receives a programming voltage of approximately seven volts at its drain terminal. When the device 42 is conducting the UPROM device 13 receives a similar programming voltage at its drain terminal.

The programming voltage is furnished from a circuit 15. Normally the circuit 15 furnishes a voltage of Vcc minus Vtn (approximately 4.3 volts) through a device 52 to a node N11 connected to the devices 41 and 42. However, when the NAND gate 28 furnishes a zero output to indicate programming is in progress, this zero value is applied to disable a reference transistor 53 while a high value is furnished from the circuit 30 to enable a transistor device 50. Enabling the device 50 causes approximately ten volts to be applied at the gate terminal of a N channel device 51 so that Vcc is replaced at node N11 by the higher value programming voltage Vpp. This programming voltage Vpp of 12.5 volts is furnished at the node N11 reduced by the biasing and Vt of the device 51. Ultimately, the programming voltage is applied at the drain of the UPROM device to be programmed.

The result of the programming voltage being applied to one of the two UPROM devices 12 or 13 is that approximately seven volts appears at the drain terminal, approximately 12.5 volts appears at the gate terminal, and ground appears at the source terminal of the selected device. These values are such that channel hot electron injection occurs to place negative charge in the floating gate region of the selected UPROM device. Consequently, the selected device is programmed. Presuming that the device 12 is programmed, the device 12 turns off. This raises the voltage at the node N12 to approximately Vcc, a one value. The one value is inverted twice and transferred to the input of the NOR gate 21 to cause a zero to be placed at the input to the NAND gate 25 and disable the ability of the circuit to program the device 13. Similarly, had the device 13 been programmed initially, then the device 13 would immediately turn off raising the voltage at the node N13 to the value of Vcc. This one value would then be transferred to the input of the NOR gate 22, inverted and applied as a zero to the NAND gate 24 to disable any programming input to the device 12.

Thus, as has been explained, the circuit of the present invention provides a means for immediately precluding the possibility of programming one of the UPROM devices of the circuit 14 once the other one of the UPROM devices has been programmed. No window of time exists during which the other UPROM device may be programmed once the first device has been programmed. Moreover, the prohibition is accomplished with only a very small number of gates and is thus quite inexpensive. This should be contrasted with prior art arrangements which accomplish the prohibition by providing a circuit with a number of elements essentially equivalent to those of the circuit 10 and which provide a time window during which inadvertent programming of the unprogrammed UPROM device may be accomplished even after a first UPROM device has already been programmed.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A UPROM circuit comprising:
   a pair of UPROM devices arranged to provide a first output level when one of the pair of UPROM devices is programmed and a second output level when another of the UPROM devices is programmed;
   circuitry for selectively providing programming voltages to each of the UPROM devices; and
   circuitry for sensing a condition of the UPROM devices to disable the circuitry for selectively providing programming voltages to each of the UPROM devices whenever one of the UPROM devices is programmed, wherein the circuitry for sensing a condition of the UPROM devices comprises:
   first and second switching circuits, each of the switching circuits being connected to disable a portion of the circuitry for selectively providing programming voltages to each of the UPROM devices; and circuitry for activating the first switching circuit when one of the UPROM devices is programmed and the second switching circuit when another of the UPROM devices is programmed.

2. A UPROM circuit as claimed in claim 1 in which the circuitry for activating the first switching circuit when one of the UPROM devices is programmed and the second switching circuit when other of the UPROM devices is programmed comprises circuitry for providing feedback from the output of each of the UPROM devices to the first and second switching circuits.

3. A UPROM circuit as claimed in claim 2 in which the circuitry for providing feedback from the output of each of the UPROM devices to the first and second switching circuits comprises logic circuitry for responding to the presence of a signal indicating programming is in progress, a signal indicating a UPROM device to be programmed, and a signal indicating a UPROM device other than the UPROM device to be programmed is already programmed to activate the switching circuit.

* * * * *